United States Patent [19]

Tseng

[11] Patent Number: 5,733,808
[45] Date of Patent: Mar. 31, 1998

[54] METHOD FOR FABRICATING A CYLINDRICAL CAPACITOR FOR A SEMICONDUCTOR DEVICE

[75] Inventor: Horng-Huei Tseng, Hsinchu, Taiwan

[73] Assignee: Vanguard International Semiconductor Corporation, Hsinchu, Taiwan

[21] Appl. No.: 585,556

[22] Filed: Jan. 16, 1996

[51] Int. Cl.[6] .................................... H01L 21/8242
[52] U.S. Cl. .................. 438/239; 438/240; 438/253; 438/254; 438/396; 438/397
[58] Field of Search ........................ 438/210, 239, 438/240, 253, 254, 396, 397

[56] References Cited

U.S. PATENT DOCUMENTS

| | | | |
|---|---|---|---|
| 5,185,282 | 2/1993 | Lee et al. | 437/47 |
| 5,330,614 | 7/1994 | Ahn | 438/396 |
| 5,399,518 | 3/1995 | Sim et al. | 437/52 |
| 5,403,767 | 4/1995 | Kim | 437/52 |
| 5,443,993 | 8/1995 | Park et al. | 437/60 |
| 5,543,345 | 8/1996 | Liaw et al. | 438/397 |
| 5,547,890 | 8/1996 | Tseng | 438/396 |
| 5,550,077 | 8/1996 | Tseng et al. | 438/396 |

*Primary Examiner*—Trung Dang
*Attorney, Agent, or Firm*—George O. Saile; Stephen B. Ackerman; William J. Stoffel

[57] ABSTRACT

The present invention provides a method of manufacturing a cylindrical capacitor for a DRAM. A resist layer is first used to pattern a first conductive layer and an oxidation barrier layer into a cylindrical bottom electrode. In a critical step, the resist layer is laterally etched removing a lateral portion of the resist layer thereby exposing an outer cylindrical section of the barrier layer. Using the now narrower (laterally plasma etched) resist layer as a mask, the exposed portions of the oxidation barrier layer are etched away. A masking layer is formed over the sidewalls and the exposed portions of the bottom electrode by an oxidation process. The oxidation barrier layer then is removed. The bottom electrode is anisotropically etched using the masking layer as a mask forming a cylindrical storage electrode. A dielectric layer and top plate electrode are formed over the storage electrode to form the capacitor.

26 Claims, 5 Drawing Sheets

METHOD FOR FABRICATING A CYLINDRICAL CAPACITOR FOR A SEMICONDUCTOR DEVICE

BACKGROUND OF THE INVENTION

1) Field of the Invention

The present invention relates generally to fabrication of capacitors in a semiconductor memory device and more particularly to a method for fabricating a highly integrated semiconductor memory having a cylindrical storage electrode for high reliability and large cell capacitance for memory cells.

2) Description of the Prior Art

The decrease in cell capacitance caused by reduced memory cell area is a serious obstacle to increasing packing density in dynamic random access memories (DRAMs). Thus, the problem of decreased cell capacitance must be solved to achieve higher packing density in a semiconductor memory device, since decreased cell capacitance degrades read-out capability and increases the soft error rate of memory cell as well as consumes excessive power during low-voltage operation by impeding device operation.

Generally, in a 64 MB DRAM having a 1.5 $\mu m^2$ memory cell area employing an ordinary two dimensional stacked capacitor cell, sufficient cell capacitance cannot be obtained even though a higher dielectric constant material, e.g., tantalum oxide ($Ta_2O_5$), is used. Therefore, stacked capacitors having a three-dimensional structure have been suggested to improve cell capacitance. Such stacked capacitor include, for example double-stacked, fin-structured, cylindrical, spread-stacked, and box structured capacitors.

Since both outer and inner surfaces can be utilized as an effective capacitor area, the cylindrical structure is favorably suitable to the three-dimensional stacked capacitor, and is more particularly suitable for an integrated memory cell which is 64 Mb or higher. Also, an improve stacked capacitor has recently been presented, where pillars or another inner cylinder is formed in the interior of the cylinder. Not only may both of the inner and outer surfaces of the cylinder be utilized as the effective capacitor area, but also the outer surface of the pillars or the inner cylinder formed in the interior of the cylinder.

The following U.S. patents show related processes and capacitor structures: U.S. Pat. Nos. 5,399,518, Sim et al.; 5,403,767, Kim; 5,443,993, Park et al.; and 5,185,282, Lee et al. For example, in U.S. Pat No. 5,399,518, Sim et al, an approach uses a structural solution to increase the storage node area and capacitance. The use of sidewall processes results in a storage node shape resembling a crown, and thus known as the crown Capacitor On Bit line (COB), structure. This shape, although resulting in greater storage node surface area than non-COB counterparts, fabricated via the use of more conventional methods, can sometimes present difficulties. For example the polysilicon "fences", created via specific sidewall processes, can break or fall off in specific locations, during subsequent processing, resulting in a decrease in capacitance in these specific locations.

However, many of these prior art methods also require substantially more processing steps or/and planar structures which make the manufacturing process more complex and costly. Also, other process methods rely on etching to a predetermined etch depth which can be quite difficult to control in a manufacturing environment. For example, during plasma etching outgassing, virtual or real leaks, back streaming from pumps and loading effects, to name a few, can change the chemistry of the etching environment in the process chamber, making a calibrated etch time approach difficult to control. Therefore, it is very desirable to develop processes that are as simple as possible and also provide methods for monitoring, in situ, the etch depth during processing.

There is a challenge to develop methods of manufacturing these capacitors that minimize the manufacturing costs and maximize the device yields. In particular, there is a challenge to develop a method which minimizes the number of photoresist masking operations and provide maximum process tolerance to maximize product yields. There is also a challenge to develop a cylindrical capacitor which is easy to manufacture.

SUMMARY OF THE INVENTION

It is an object of the present invention to provide a novel method for fabricating a cylindrical capacitor, which ensures high reliability and large cell capacitance of the memory device.

It is another object of the present invention to provide a novel method for fabricating an optimized capacitor structure of a semiconductor memory device, which is less prone to structural damage, in terms of damaged fences, and has a large cell capacitance of the memory device.

It is another object of the present invention to provide a method for fabricating a cylindrical capacitor of a semiconductor memory device, which is easy to manufacture, inexpensive to manufacture and uses a minimum number of masking operations.

To accomplish the above objectives, the present invention provides a method of manufacturing a cylindrical capacitor for a DRAM which has an unique process for forming the storage electrode. A first conductive layer and an oxidation barrier layer are formed on a first insulation layer. The first conductive layer fills a contact hole. A resist layer, defining a cylindrical bottom electrode, is formed over the oxidation barrier layer. Using the resist layer as a mask, the oxidation barrier layer and the first conductive layer are etched thereby forming a bottom electrode.

In a critical step, the resist layer is laterally etched removing a lateral portion of the resist layer thereby exposing an outer cylindrical section of the barrier layer. Using the laterally etched resist layer as a mask, the exposed portions of the oxidation barrier layer are etched away. The resist layer is then removed. A masking layer (e.g., polyoxide) is formed over the sidewalls and the exposed portions of the bottom electrode by an oxidation process. The oxidation barrier layer then is removed. The bottom electrode is anisotropically etched using the masking layer as a mask forming a cylindrical electrode having a central channel.

Briefly, the present invention provides a method of fabricating a crown shaped electrode for capacitors for semiconductor memory devices. After forming a source, drain and gate electrode, an etch barrier layer is formed over a substrate surface. Next a first insulation layer having a contact hole over the source is formed over the substrate surface. A first conductive layer is formed on the first insulation layer and fills the contact hole. Then an oxidation barrier layer is formed over the first conductive layer. A resist layer is formed over the oxidation barrier layer. The resist layer has a cylindrical section over the contact hole which defines a bottom electrode 24. Next, the oxidation barrier layer and the first conductive layer are etched using the resist layer as a mask thereby forming a bottom electrode.

In the next important step, the resist layer is isotropically plasma etched removing a lateral portion of the resist layer thereby exposing outer portions of the oxidation barrier layer. The portion of the resist removed has a width in the range of between about 0.05 and 0.15 µm. The plasma etch process is very controllable and allows smaller dimensions to be defined compared to conventional photolithographic processes.

Next, the exposed portions of the barrier layer are etched away using the resist layer as a mask thereby exposing peripheral portions of the bottom electrode. The resist layer is then removed. The sidewalls and the exposed portions of the bottom electrode are then oxidized forming a masking layer over the sidewalls and the exposed portions of the bottom electrode. The oxidation barrier layer to prevents oxidation the portions covered by the oxidation barrier layer. The oxidation barrier layer is then removed. The bottom electrode is anisotropically etched using the masking layer as a mask forming a cylindrical electrode having a central channel. The masking layer and the first insulation layer are selectively etched using the etch barrier layer as an etch stop. A capacitor dielectric layer and a top plate electrode are formed over the bottom electrode thereby completing the cylindrical capacitor.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

Now in keeping with the objectives of this invention, the method for forming a DRAM storage capacitor having a cylindrical electrode is described in detail. The sequence of fabrication steps for a crown electrode is shown in FIGS. 1 through 10. The process for forming the field oxide and the field effect transistor structure as present practiced in manufacturing DRAM cells are only briefly described in order to better understand the current invention. It should be well understood by one skilled in the art that by including additional process steps not described in this embodiment, other types of devices can also be included on the DRAM chip. For example, P wells in the P substrate and CMOS circuit can be formed therefrom. It should also be understood that the figures depict only one DRAM storage cell out of a multitude of cells that are fabricated simultaneously on the substrate. Also, the capacitor can be used in other chip types in addition to DRAM chips.

Figure 1:
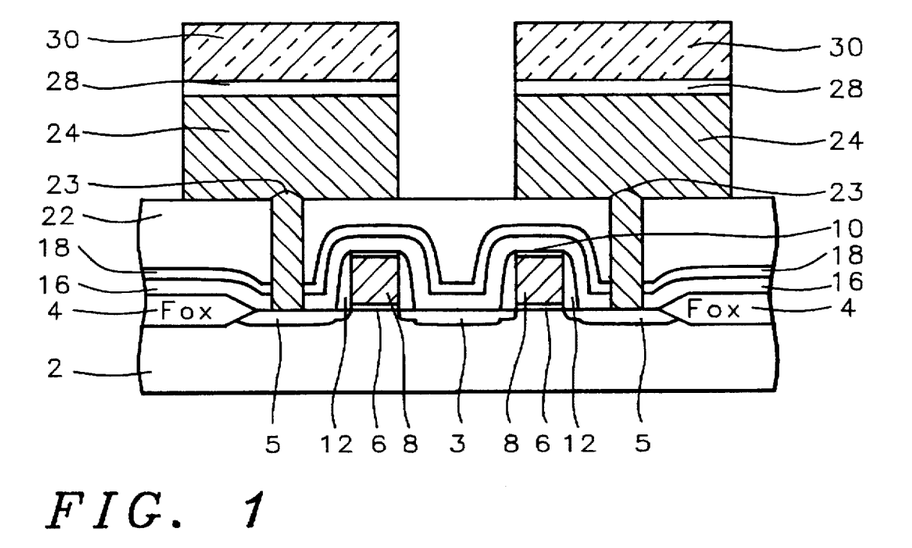
FIGS. 1 through 10 are cross sectional views for illustrating a method for manufacturing a cylindrical capacitor of a semiconductor memory device according to the present invention.

Referring now to FIG. 1, a cross-sectional view of the substrate 2 having a partially completed DRAM cell formed on the substrate surface, is schematically shown. A field oxide layer 4 is formed on a semiconductor substrate 10 for defining active regions and isolation regions. The preferred substrate is composed of a P-type single crystal silicon having a (100) crystallographic orientation. A relatively thick field oxide (FOX) 4 is formed around the active device areas to electrically isolate these areas. This field oxide is formed by masking the active device areas with a thick silicon oxide (pad oxide) and a thicker silicon nitride layer which forms an oxidation barrier. The silicon substrate is then oxidized in an oxidizing ambient to form the field oxide. The preferred thickness being in the range of about 3000 and 6000 Å.

The semiconductor device is then formed in the active device area after removing the silicon nitride barrier layer and the pad oxide in a conventional wet etch. The most commonly used device for dynamic random access memory is MOSFET. This device is formed by first thermally oxidizing the active device area to form a thin gate oxide 6. The preferred thickness being from about 50 to 200 Å.

An appropriately doped polysilicon layer and an insulating layer are deposited on substrate 2 and conventional photolithographic techniques are used to pattern the gate oxide layer 6, polysilicon layer 8, and the insulating layer 10. This forms the gate electrode 6 8 10 of the MOSFET in the active device areas and conductive patterns (i.e. word lines, not shown) elsewhere on the substrate. Portions of the conductive patterns form the word lines that electrically connect the MOSFET gate electrode to the appropriate peripheral circuit s on the DRAM chip.

The lightly doped source and drain of the N-channel MOSFET can be formed next, usually by implanting an N-type atomic species, such as arsenic or phosphorus, through the spaces between the gate electrodes 18 19 21. For example, a typical implant might consist of phosphorus P31 at a dose of between about 1 and 1E13 atoms/cm$^2$ and at an energy between about 30 and 80 Kev.

After forming the lightly doped source/drain regions, sidewall spacers 12 are formed on the gate electrode sidewalls. These sidewall spacers 12 are formed by depositing a low temperature silicon oxide and anisotropically etching back to the silicon substrate surface. For example, the silicon oxide could be a chemical vapor deposition using tetraethoxysilane (TEOS) at a temperature in the range of about 650° to 900° C. and the etch back performed in a low pressure reactive ion etcher.

The source/drain regions 35 of the MOSFET are now implanted between the spacers 12 and the field oxide 4 with a N type atomic species, for example, arsenic (As75), to complete the source/drain (node contact) 14. The implantation is usually done through a thin layer of silicon oxide of about 200 and 300 Å in thickness to minimize implant channeling and to protect against contamination by metals and other impurities. A typical implantation dose being between 2E15 and 1E16 atoms/cm$^2$ and an energy of between about 20 and 70 Kev.

Following this, a conformal insulating layer 16 is formed over the substrate surface and contacts the source 5 and drain 3 as shown in FIG. 1. The conformal insulating layer is preferably formed of silicon nitride, silicon oxide or a combination of silicon nitride and silicon oxide. The conformal insulating layer 16 is preferably composed of silicon oxide formed by a low temperature tetraethylorthosilicate (TEOS) process. Layer 16 preferably has a thickness in the range between about 500 and 1000 Å.

The remainder of this embodiment relates more specifically to those objects of the invention, which relate to the formation of the storage capacitor having increased capacitance and also providing a more manufacturable process. Now an etch barrier layer 18 is formed over a substrate surface. The etch barrier 18 can be formed of silicon nitride and has a thickness in the range of between about 500 and 1000 Å.

Subsequently, a first insulation layer 22 is formed over the substrate surface (FIG. 1). The first insulation layer 22 can be composed of a material selected from the group consisting of phosphosilicate glass (PSG), silicon oxide, and borophosphosilicate glass. The first insulation layer can be formed of silicon oxide formed by a low temperature chemical vapor deposition using tetraethoxysilane (TEOS). The first insulation layer 30 is preferably formed of borophosphosilicate glass (BPSG). The first insulating layer 30 can have a thickness in the range of about 4000 and 10,000 Å.

As a beginning step in forming electrode contacts to the drains (e.g., node contact), an contact opening 23 is formed over the drains 14 through the first insulation layer 22, the barrier layer 18, and the conformal layer 16 which exposes the drain 4 The contact hole 23 can have a depth in the in the range between about 0.4 and 1.0 µm and a width in the range of between about 0.2 and 0.5 µm. The opening can by formed by conventional photolithographic techniques.

A first conductive layer is then formed over the first insulation layer 22. The first conductive fills the contact hole 23 and forms an electrical contact to the underlying source 5. The first conductive layer 24 is preferably formed of doped polysilicon material. The first conductive layer is preferably composed of polysilicon formed using a LPCVD reactor at a process temperature of between about 550° and 650° C. The polysilicon layer 24 can be doped N-type by ion implantation using, for example, arsenic ions and having an implant dose of between about 1E15 and 2E15 atoms/cm$^2$ and an ion energy of between about 20 and 80 Kev. Alternatively, the polysilicon layer can be doped in situ during the polysilicon deposition. The first conductive layer preferably has a thickness in the range between about 3000 and 8000 Å and more preferably a thickness of about 6000 Å. The first conductive layer is preferably n doped and preferably has an impurity concentration in the range of between about 1E20 and 1E22 atoms/cm$^3$.

As shown in FIG. 1, an oxidation barrier layer 28 is formed over the first conductive layer. The oxidation barrier layer 28 is preferably formed of silicon nitride; and preferably has a thickness in the range of between about 300 and 800 Å and more preferably about 400 Å.

A resist layer 30 is then formed over the oxidation barrier layer 28. The resist layer 30 having openings defining a storage electrode 24. The resist layer preferably has portions which cover the storage holes 23 and portions of the surrounding oxidation barrier layer 28. The resist layer 30 can have any shape, such as square, circular, triangular. The resist layer 30 is preferably formed of positive type resist. The resist layer 30 can have thickness in the range of between about 1.0 and 1.5 µm.

Figure 2:
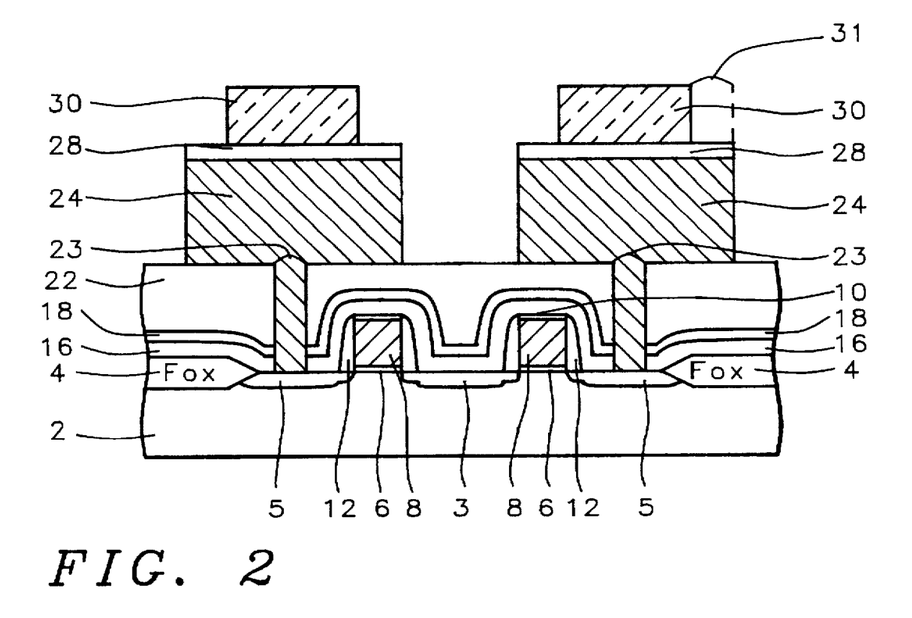

Next, the oxidation barrier layer 28 and the first conductive layer are anisotropically etched using the resist layer 30 as a mask thereby forming a bottom electrode 24. A RIE etch preferably using $CF_4$ or $CHF_3$ can be used to etch the silicon nitride barrier layer 28. This silicon nitride etch preferably has a selectivity to $SiO_2$ from about 10:1 to 20:1. Also, a polysilicon reactive ion etch (RIE) with a selectivity to silicon oxide greater than 10:1 is preferably used. A plasma etch using $Cl_2$ has a high selectivity to etch polysilicon.

Figure 3:
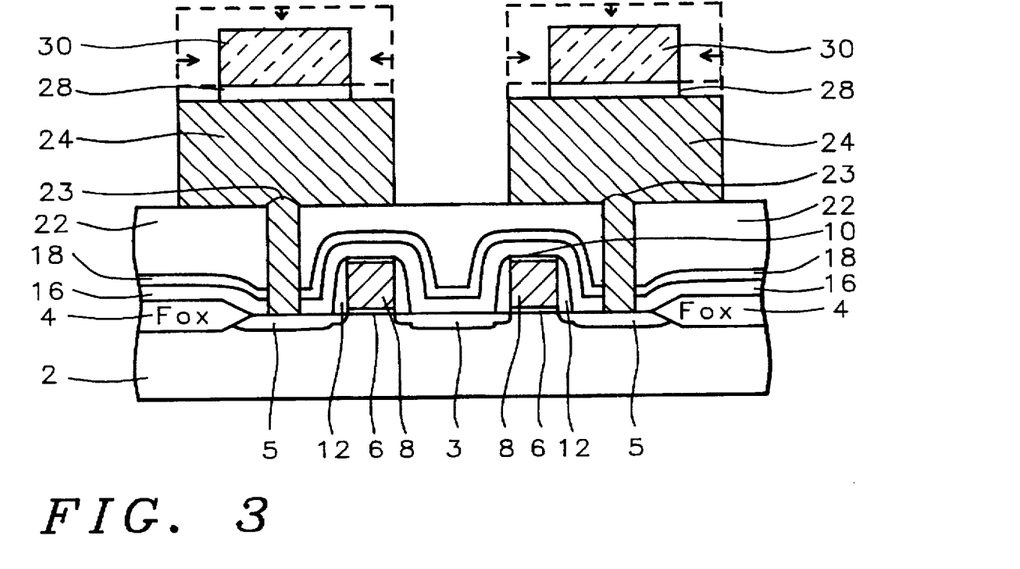

In a critical step, the resist layer 30 is laterally etched removing a lateral portion 31 of the resist layer 30 thereby exposing outer portions of the oxidation barrier layer 28. The lateral etch of the resist layer 30 is preferably performed with an oxygen plasma etch. Preferably argon is the carrier gas. The lateral resist etch can be any isotropic resist etch. Also, the lateral resist etch can be performed in an oxide etch which also etches the etch barrier layer 28. The oxygen plasma etch can be performed an conventional oxygen plasma tool, such as a Branson/International plasma Corp. Model 3100 (i.e., IPC 3100). The plasma etching of the resist layer removes a lateral width of the resist layer in the range of between about 0.05 and 0.15 µm.

Figure 4:
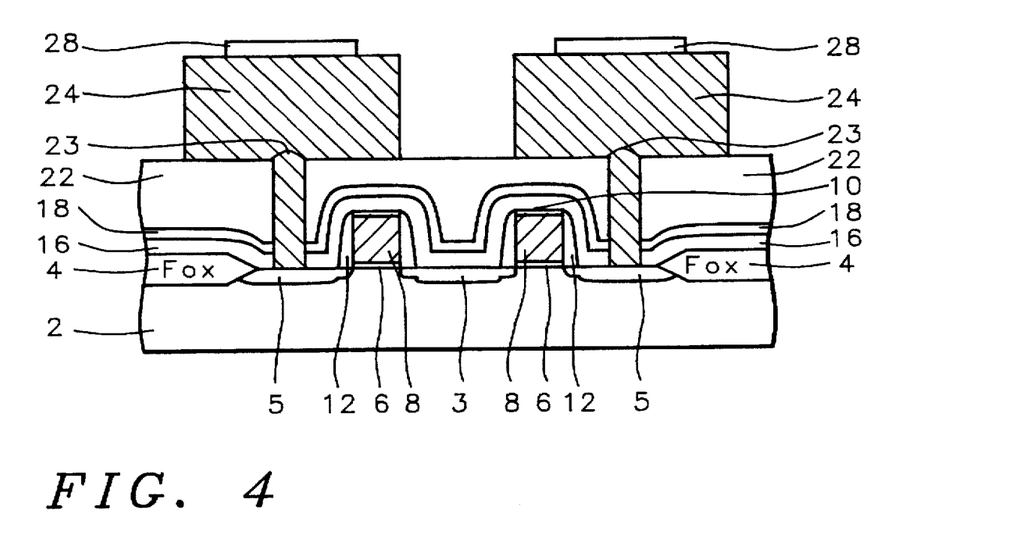

The exposed portions of the oxygen barrier layer 28 are etch using the resist layer 30 as a mask thereby exposing peripheral portions of the bottom electrode 24. The silicon nitride etch preferably has a selectivity of at least 10:1 to silicon oxide. As shown in FIG. 4, the resist layer 30 is then removed.

Figure 5:
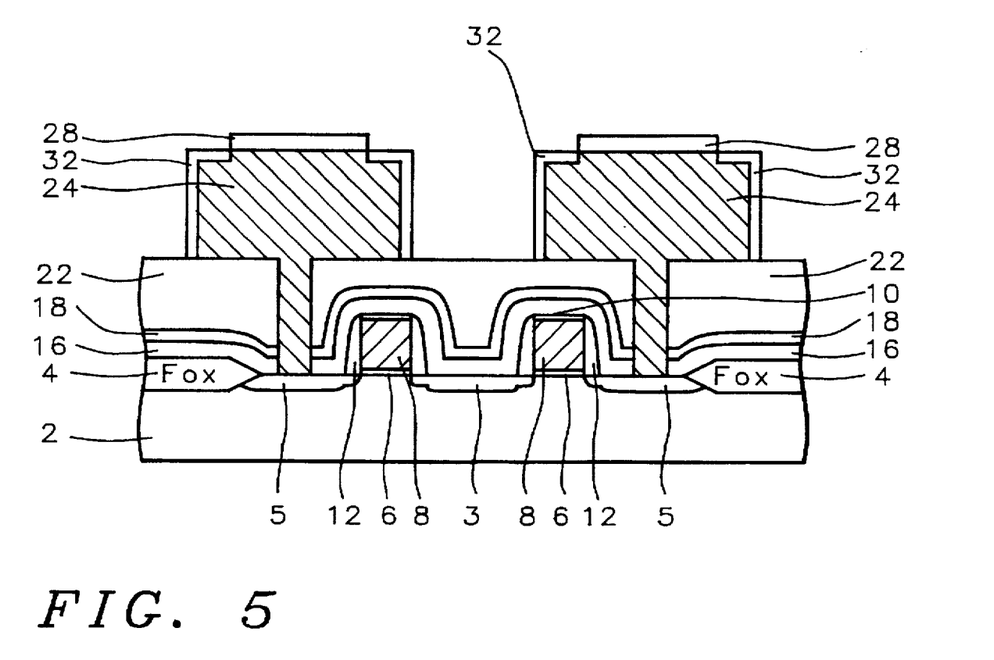

As shown in FIG. 5, a masking layer 32 is formed over portions of the bottom electrode 24. The masking layer 32 is preferably formed of polyoxide. The masking layer 32 is preferably formed when the sidewalls mid the exposed portions of the bottom electrode are oxidized thereby forming a masking layer 28 over the sidewalls and the exposed portions of the bottom electrode. The oxidation barrier layer 28 prevents the oxidation of the portions of the bottom electrode 24 covered by the oxidation barrier layer 28. The masking layer 32 has a thickness in the range between about 300 and 900 Å. The masking layer 32 is preferably formed of polyoxide. The oxidation of the sidewalls and the exposed portions of the bottom electrode can comprise a wet thermal oxidation at a temperature in the range of between about 700° and 900° C. and preferably uses $H_2O$ and $N_2$ reactants. Alternately, the oxidation can be a dry oxidation (e.g., dry $O_2$) at a temperature in the range of between about 700° and 900° C.

Figure 6:
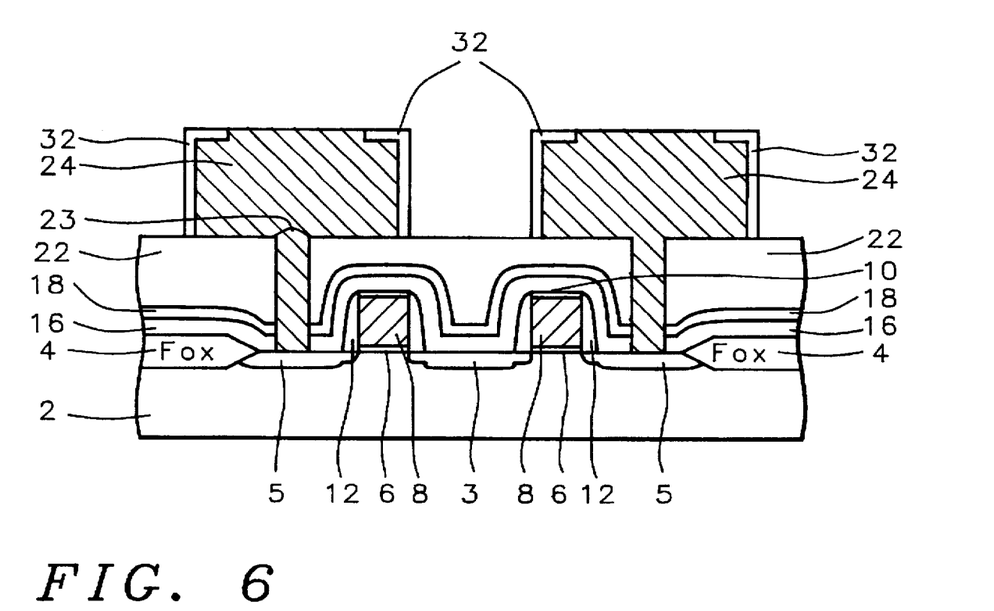

As shown in FIG. 6, the oxidation barrier layer 28 is now removed thereby exposing a central portion of the bottom electrode 24.

Figure 7:
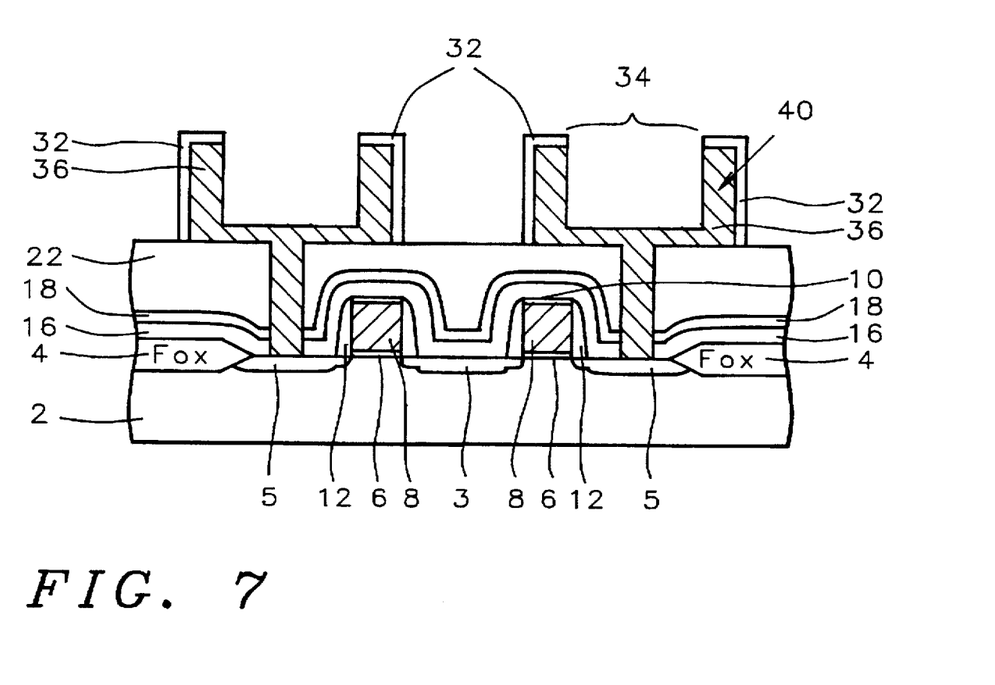

As shown in FIG. 7, the exposed central portions of the bottom electrode is anisotropically etched using the masking layer 32 as a mask forming a central channel 34 and a ridge of the bottom electrode 40. The anisotropic etch of the bottom electrode preferably is a reactive ion etch and has a selectivity to polysilicon over polyoxide of at least 20:1.

The central channel 34 has a width in the range between about 0.1 and 0.3 µm and a depth in the range between about 0.3 and 0.8 µm and more preferably about 0.6 µm. The ridges 36 have a width in the range between about 0.1 and 0.3 µm and a height in the range between about 0.3 and 0.8 µm. The masking layer is then removed. Preferably the masking layer is removed with a buffered oxide etch (BOE) such as a dilute HF etch.

Figure 8:
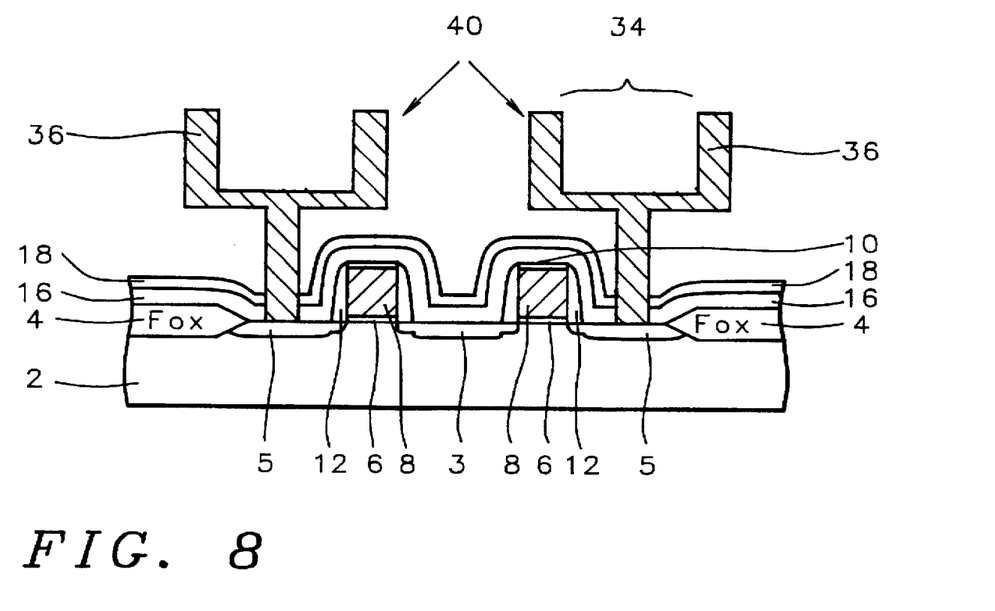

As displayed in FIG. 8, the masking layer 32 and the first insulation layer 22 are selectively etched using the etch barrier layer 18 as an etch stop. The selective etching of the masking layer 32 and the first isolation layer 22 is preferably performed using buffered HF etch.

Figure 9:
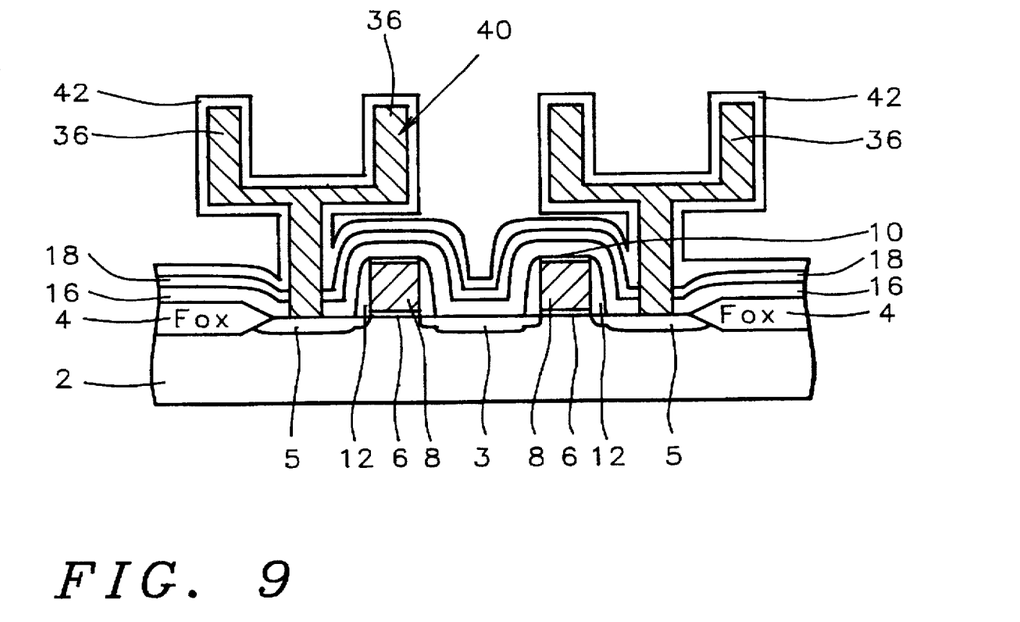

Referring to FIG. 9, a capacitor dielectric layer 42 can be formed of an high dielectric layer such as, $Ta_2O_5$, silicon nitride or a three layer film of silicon oxide/silicon nitride/ silicon oxide (ONO). Preferably, the conformal dielectric layer is formed of three layer film of silicon oxide/silicon nitride/silicon oxide (ONO). The conformal dielectric layer 42 preferably has at thickness in the range between about 20 and 100 Å.

Figure 10:
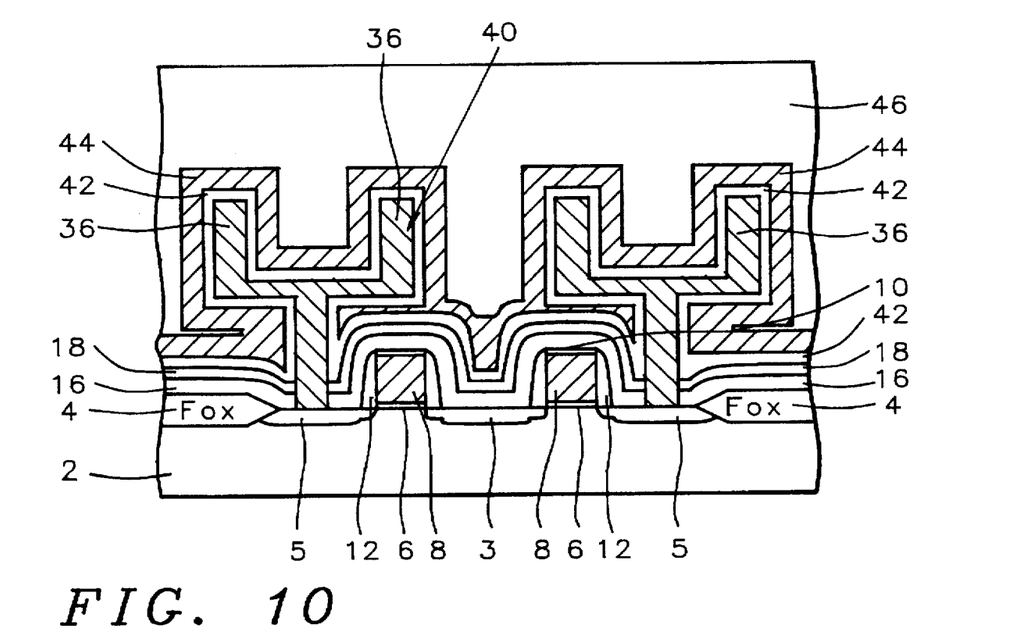

As shown in FIG. 10, a top plate electrode 44 is formed over the capacitor dielectric layer. The top plate electrode 44 is preferably formed of doped polysilicon. The top plate electrode preferably has a thickness in the range between about 1000 and 2000 Å. The top plate electrode is preferably doped by an ion implant process or by an in-situ doped process. The top plate is preferably doped with a n-type impurity and preferably has an impurity concentration in the range of between about 1E20 and 1E22 atoms/cm$^3$. The top plates electrically connect adjacent capacitors as shown in FIG. 10.

A top insulation layer 46 is formed over the resulting surface. A metal layer 48 is then formed over the top insulation layer 46. The top insulation layer can be formed of silicon oxide, doped silicon oxide, phosphosilicate glass (PSG), and borophosphosilicate glass (BPSG). The top insulation layer if preferably formed of borophosphosilicate glass (BPSG) and preferably has a thickness in the range of between about 3000 and 8000 Å.

According to the present invention, a simple, cost efficient method to form a cylindrical capacitor is provided. The invention uses an unique lateral plasma etch of a resist layer to define the width of the ridges of the cylindrical capacitor. The lateral etch allows the width of the central channel to be formed beyond the lithography limits and also eliminates a masking step. Since the thin ridge 36 of the bottom electrode is define by the width of photo resist removed by the lateral plasma etch, the process is controllable and allows a smaller definition than photo processes. The invention provides a simple and inexpensive method of forming reliable, high capacitance capacitors.

While the invention has been particularly shown and described with reference to the preferred embodiments thereof, it will be understood by those skilled in the an that various changes in form and details may be made without departing from the spirit and scope of the invention.

What is claimed is:

1. A method of fabricating a cylindrical capacitor comprises the steps of:

a) forming an etch barrier layer over a substrate surface;

b) forming a first insulation layer over said etch barrier layer;

c) forming a contact hole through said first insulation layer and said etch barrier layer;

d) forming a first conductive layer on said first insulation layer and filling said contact hole;

e) forming an oxidation barrier layer over said first conductive layer;

f) forming a resist layer over said oxidation barrier layer; said resist layer having openings defining a storage electrode;

g) etching said oxidation barrier layer and said first conductive layer using said resist layer as a mask thereby forming a bottom electrode; said bottom electrode having sidewalls;

h) laterally etching said resist layer removing a lateral portion of said resist layer thereby exposing outer portions of said oxidation barrier layer;

i) etching said exposed outer portions of said oxidation barrier layer using the remaining resist layer as a mask thereby exposing peripheral portions of said bottom electrode;

j) removing said resist layer;

k) oxidizing said sidewalls and said exposed peripheral portions of said bottom electrode forming a masking layer over said sidewalls and said exposed portions of said bottom electrode;

l) removing said oxidation barrier layer exposing a central portion of said bottom electrode;

m) anisotropically etching said bottom electrode using said masking layer as an etch mask forming a central channel and a ridge of said bottom electrode;

n) selectively etching said masking layer and said first insulation layer using said etch barrier layer as an etch stop;

o) forming a capacitor dielectric layer covering at least said bottom electrode; and p) forming a top plate electrode over said capacitor dielectric layer thereby completing said cylindrical capacitor.

2. The method of claim 1 wherein said etch barrier layer is formed of silicon nitride and has a thickness in the range of between about 500 and 1000 Å.

3. The method of claim 1 wherein said first insulation layer is composed of a material selected from the group consisting of silicon oxide and borophosphosilicate glass; and has a thickness in the range between about 4000 and 10,000 Å.

4. The method of claim 1 wherein said oxidation barrier layer is formed of silicon nitride; and has a thickness in the range of between about 300 and 800 Å.

5. The method of claim 1 wherein said resist layer is formed of positive type resist with a thickness in the range of between about 1.0 and 1.5 μm.

6. The method of claim 1 wherein said bottom electrode is formed of doped polysilicon having an impurity concentration in the range between about 1E20 and 1E22 atoms/cm$^3$ and a thickness in the range between about 3000 and 8000 Å.

7. The method of claim 1 wherein said masking layer is formed by oxidizing said first conductive layer and said masking layer has a thickness in the range between about 300 and 800 Å; said masking layer is formed of silicon oxide and polysilicon.

8. The method of claim 1 wherein in said step (h) said lateral etching of said resist layer comprises a plasma etch using an oxygen reactant.

9. The method of claim 1 wherein in step (h) said lateral etching of said resist layer removes a lateral portion of said resist layer having a width in the range of between about 0.05 and 0.15 μm.

10. The method of claim 1 wherein said anisotropic etch of said bottom electrode is a reactive ion etch and has a selectivity to polysilicon over polyoxide of between about 10:1 and 30:1.

11. The method of claim 1 wherein said oxidizing said sidewalls and said exposed portions of said bottom electrode comprise a wet thermal oxidation at a temperature in the range of between about 700° and 900° C.; and uses H$_2$O and N$_2$ reactants.

12. The method of claim 1 wherein said central channel has a width in the range between about 0.1 and 0.3 μm and a depth in the range between about 0.3 and 0.8 μm.

13. The method of claim 1 wherein said ridges have a width in the range between about 0.1 and 0.3 μm; and a height in the range between about 0.3 and 0.8 μm.

14. The method of claim 1 wherein said selective etching of said masking layer and said first isolation layer is performed with a buffered HF etch.

15. The method of claim 1 wherein said capacitor dielectric is composed of a material selected from the group consisting of: silicon oxide/silicon nitride/silicon oxide (ONO), silicon nitride and Ta$_2$O$_5$; and has a thickness in the range between about 20 and 100 Å.

16. The method of claim 1 wherein said top plate electrode is formed of doped polysilicon having a thickness in the range between about 1000 and 2000 Å and an impurity concentration in the range between about 1E20 and 1E22 atoms/cm$^3$.

17. A method of fabricating a crown capacitor comprises the steps of:
   a) forming an silicon nitride etch barrier layer over a substrate surface;
   b) forming a first silicon oxide layer over said silicon nitride etch barrier layer;
   c) forming a contact hole through said first insulation layer and said silicon nitride etch barrier layer;
   d) forming a first polysilicon layer on said first insulation layer and filling said contact hole;
   e) forming a silicon nitride layer over said first conductive layer;
   f) forming a resist layer over said silicon nitride layer; said resist layer having openings defining a storage electrode;
   g) etching said silicon nitride layer and said first polysilicon layer using said resist layer as a mask thereby forming a storage electrode; said storage electrode having sidewalls;
   h) laterally etching said resist layer removing a lateral portion of said resist layer thereby exposing outer portions of said silicon nitride layer;
   i) etching said exposed outer portions of said silicon nitride layer using the resist layer as a mask thereby exposing peripheral portions of said storage electrode;
   j) removing said resist layer exposing a central portion of said storage electrode;
   k) oxidizing said sidewalls and said exposed peripheral portions of said storage electrode forming a masking layer over said sidewalls and said exposed portions of said storage electrode; said silicon nitride layer to prevent oxidizing the portions covered by said silicon nitride layer;
   l) removing said barrier layer exposing a central portion of said storage electrode;
   m) anisotropically etching said exposed central portion of said storage electrode using said masking layer as a mask forming a central channel and a ridge;
   n) selectively etching said masking layer and said first insulation layer using said etch barrier layer as an etch stop;
   o) forming a capacitor dielectric layer covering at least said storage electrode; and
   p) forming a top plate electrode over said capacitor dielectric layer thereby completing said crown capacitor.

18. The method of claim 17 wherein said masking layer has a thickness in the range between about 300 and 800 Å; said masking layer is formed of silicon oxide and polysilicon.

19. The method of claim 17 wherein said laterally etching of said resist layer comprises a plasma etch using an oxygen reactant.

20. The method of claim 17 wherein said plasma etching of said resist layer removes a lateral portion of said resist layer having a width in the range of between about 0.05 and 0.15 μm.

21. The method of claim 17 wherein said selective etching of said masking layer and said first isolation layer is performed with a buffered HF etch.

22. A method of fabricating a memory cell having a cylindrical storage capacitor comprises the steps of:
   a) forming a plurality of active regions in a semiconductor substrate each comprising a gate electrode, a source electrode, and a drain electrode;
   b) forming insulating layers in portions of said substrate to separate etch of said active regions from adjacent active regions;
   c) forming an interlayer oxide over all exposed surfaces of said active regions, said insulating layers and said substrate;
   d) forming an etch barrier layer over said interlayer oxide;
   e) forming a first insulation layer over said etch barrier layer;
   f) forming a contact hole through said first insulation layer and said etch barrier layer;
   g) forming a first conductive layer on said first insulation layer and filling said contact hole;
   h) forming an oxidation barrier layer over said first conductive layer;
   i) forming a resist layer over said oxidation barrier layer; said resist layer having openings defining a storage electrode;
   j) etching said oxidation barrier layer and said first conductive layer using said resist layer as a mask thereby forming a bottom electrode; said bottom electrode having sidewalls;
   k) isotropically plasma etching said resist layer removing a lateral portion of said resist layer thereby exposing outer portions of said oxidation barrier layer;
   l) etching said exposed outer portions of said oxidation barrier layer using the remaining resist layer as a mask thereby exposing peripheral portions of said bottom electrode;
   m) removing said resist layer;
   n) oxidizing said sidewalls and said exposed peripheral portions of said bottom electrode forming a masking layer over said sidewalls and said exposed portions of said bottom electrode; said oxidation barrier layer to prevent the oxidization of the portions covered by said oxidation barrier layer;
   o) removing said oxidation barrier layer exposing a central portion of said bottom electrode;
   p) anisotropically etching said bottom electrode using said masking layer as a mask forming a central channel and a ridge of said bottom electrode;
   q) selectively etching said masking layer and said first insulation layer using said etch barrier layer as an etch stop;
   r) forming a capacitor dielectric layer covering at least said bottom electrode; and
   s) forming a top plate electrode over said capacitor dielectric layer thereby completing the cylindrical capacitor and memory cell.

23. The method of claim 22 wherein said masking layer has a thickness in the range between about 300 and 800 Å; said masking layer is formed of silicon oxide and polysilicon.

24. The method of claim 22 wherein said laterally etching of said resist layer comprises a plasma etch using an oxygen reactant.

25. The method of claim 22 wherein said plasma etching of said resist layer removes a lateral portion of said resist layer with width in the range of between about 0.05 and 0.15 μm.

26. The method of claim 22 wherein said selective etching of said masking layer and said first isolation layer is performed with a buffered HF etch.

* * * * *